US011228007B2

(12) United States Patent
Guo et al.

(10) Patent No.: US 11,228,007 B2
(45) Date of Patent: Jan. 18, 2022

(54) FLEXIBLE SUBSTRATE, DISPLAY PANEL, AND METHOD OF FABRICATING FLEXIBLE SUBSTRATE COMPRISING STRENGTHENING LAYER AND FLEXIBLE MATERIAL

(71) Applicant: BOE Technology Group Co., Ltd., Beijing (CN)

(72) Inventors: Yuanzheng Guo, Beijing (CN); Pinfan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 342 days.

(21) Appl. No.: 16/484,101

(22) PCT Filed: Feb. 22, 2019

(86) PCT No.: PCT/CN2019/075840
§ 371 (c)(1),
(2) Date: Aug. 7, 2019

(87) PCT Pub. No.: WO2020/057055
PCT Pub. Date: Mar. 26, 2020

(65) Prior Publication Data
US 2021/0336162 A1  Oct. 28, 2021

(30) Foreign Application Priority Data
Sep. 19, 2018  (CN) .......................... 201811092179.2

(51) Int. Cl.
H01L 51/00  (2006.01)
H01L 27/32  (2006.01)
(Continued)

(52) U.S. Cl.
CPC ...... *H01L 51/0097* (2013.01); *H01L 27/3262* (2013.01); *H01L 51/56* (2013.01);
(Continued)

(58) Field of Classification Search
CPC .......... H01L 31/03926; H01L 27/1218; H01L 27/3262; H01L 2227/323; H01L 2251/5338; H01L 51/0097; H01L 51/56
See application file for complete search history.

(56) References Cited

U.S. PATENT DOCUMENTS

2007/0114679 A1  5/2007  Kordus, II et al.
2015/0034935 A1  2/2015  Choi
(Continued)

FOREIGN PATENT DOCUMENTS

CN  103545321 A  1/2014
CN  103887261 A  6/2014
(Continued)

OTHER PUBLICATIONS

International Search Report & Written Opinion dated Jun. 25, 2019, regarding PCT/CN2019/075840.
(Continued)

*Primary Examiner* — Hoai V Pham
(74) *Attorney, Agent, or Firm* — Intellectual Valley Law, P.C.

(57) ABSTRACT

A flexible substrate is provided. The flexible substrate includes a flexible base substrate made of a flexible material. The flexible base substrate has a plurality of gaps and a plurality of solid non-gap portions, at least two adjacent solid non-gap portions of the plurality of solid non-gap portions being interconnected. The flexible base substrate includes a strengthening layer in the plurality of solid non-gap portions, the strengthening layer including a strengthening material having a Young's modulus greater than a Young's modules of the flexible material.

20 Claims, 11 Drawing Sheets

(51) Int. Cl.
 H01L 51/56 (2006.01)
 H01L 27/12 (2006.01)
(52) U.S. Cl.
 CPC .... *H01L 27/1218* (2013.01); *H01L 2227/323* (2013.01); *H01L 2251/5338* (2013.01)

(56) References Cited

U.S. PATENT DOCUMENTS

| | | |
|---|---|---|
| 2015/0287747 A1 | 10/2015 | Cheng et al. |
| 2016/0284774 A1 | 9/2016 | Zhang |
| 2018/0219163 A1 | 8/2018 | Qin |
| 2019/0305233 A1* | 10/2019 | Yoo .................... H01L 51/0097 |

FOREIGN PATENT DOCUMENTS

| | | |
|---|---|---|
| CN | 105870352 A | 8/2016 |
| CN | 106129062 A | 11/2016 |
| CN | 106169481 A | 11/2016 |
| CN | 108022961 A | 5/2018 |
| CN | 108257982 A | 7/2018 |
| CN | 207766663 U | 8/2018 |
| JP | 2018137196 A | 8/2018 |

OTHER PUBLICATIONS

First Office Action in the Chinese Patent Application No. 2018110921792, dated Aug. 27, 2019; English translation attached.

\* cited by examiner

FLEXIBLE SUBSTRATE, DISPLAY PANEL, AND METHOD OF FABRICATING FLEXIBLE SUBSTRATE COMPRISING STRENGTHENING LAYER AND FLEXIBLE MATERIAL

CROSS-REFERENCE TO RELATED APPLICATION

This application is a national stage application under 35 U.S.C. § 371 of International Application No. PCT/CN2019/075840, filed Feb. 22, 2019, which claims priority to Chinese Patent Application No. 201811092179.2, filed Sep. 19, 2018, the contents of which are incorporated by reference in the entirety.

TECHNICAL FIELD

The present invention relates to display technology, more particularly, to a flexible substrate, a display panel, and a method of fabricating a flexible substrate.

BACKGROUND

Comparing with a liquid crystal display (LCD) apparatus, an organic light-emitting diode (OLED) apparatus has advantages including self-luminescence, fast response, wide viewing angle, high brightness, bright color, light weight, and thin thickness. An OLED apparatus includes an anode layer, a hole transport layer, a hole injection layer, a pixel definition layer, an electron injection layer, an electron transport layer, a cathode layer, etc., formed on a base substrate.

A flexible display device including OLED may be stretchable. The stretchable display apparatuses have been widely used in display industry.

SUMMARY

In one aspect, the present invention provides a flexible substrate, comprising a flexible base substrate comprising a flexible material; wherein the flexible base substrate has a plurality of gaps and a plurality of solid non-gap portions, at least two adjacent solid non-gap portions of the plurality of solid non-gap portions being interconnected; and the flexible base substrate comprises a strengthening layer in the plurality of solid non-gap portions, the strengthening layer comprising a strengthening material having a Young's modulus greater than a Young's modules of the flexible material.

Optionally, the strengthening layer is embedded in the flexible material.

Optionally, the flexible substrate further comprises a barrier layer on the plurality of solid non-gap portions of the flexible base substrate.

Optionally, an orthographic projection of the barrier layer on the flexible base substrate substantially overlaps with an orthographic projection of the strengthening layer on the flexible base substrate.

Optionally, the strengthening layer comprises a metallic material.

Optionally, at least a portion of a periphery of the strengthening layer is exposed to the plurality of gaps.

Optionally, the flexible substrate is a stretchable substrate.

Optionally, the strengthening layer comprises a plurality of strengthening blocks spaced apart from each other, a respective one of which being in a respective one of the plurality of solid non-gap portions.

In another aspect, the present invention provides a display panel, comprising the flexible substrate described herein; and a plurality of light emitting elements on the plurality of solid non-gap portions of the flexible base substrate.

Optionally, the display panel further comprises a barrier layer on the plurality of solid non-gap portions of the flexible base substrate; wherein the plurality of light emitting elements are on a side of the barrier layer away from the flexible base substrate.

Optionally, the display panel further comprises an encapsulating layer on aside of the plurality of light emitting elements away from the flexible base substrate, encapsulating the plurality of light emitting elements and a plurality of thin film transistors on the plurality of solid non-gap portions of the flexible base substrate.

Optionally, the display panel further comprises a back film on a side of the flexible base substrate away from the plurality of light emitting elements; wherein the back film has a stretchability equal to or less than a stretchability of a remainder of the display panel.

Optionally, the display panel further comprises an array of a plurality of thin film transistors, a plurality of gate lines, and a plurality of data lines, on the plurality of solid non-gap portions of the flexible base substrate; a respective one of the plurality of gate lines is connected to a row of thin film transistors of the array of the plurality of thin film transistors; and a respective one of the plurality of data lines is connected to a column of thin film transistors of the array of the plurality of thin film transistors; wherein the respective one of the plurality of gate lines extends through regions corresponding to multiple interconnected solid non-gap portions of the plurality of solid non-gap portions along a row direction of the array of the plurality of thin film transistors; and the respective one of the plurality of data lines extends through regions corresponding to multiple interconnected solid non-gap portions of the plurality of solid non-gap portions along a column direction of the array of the plurality of thin film transistors.

Optionally, the display panel is a stretchable display panel.

In another aspect, the present invention provides a method of fabricating a flexible substrate, comprising forming a flexible base substrate comprising a flexible material; wherein forming the flexible base substrate comprises forming a plurality of gaps and forming a plurality of solid non-gap portions, at least two adjacent solid non-gap portions of the plurality of solid non-gap portions formed to be interconnected; and forming the flexible base substrate comprises forming a strengthening layer in the plurality of solid non-gap portions, the strengthening layer formed to comprise a strengthening material having a Young's modulus greater than a Young's modules of the flexible material.

Optionally, forming the flexible base substrate further comprises forming a first flexible sub-layer; forming the strengthening layer on the first flexible sub-layer; and forming a second flexible sub-layer on a side of the strengthening layer away from the first flexible sub-layer, the second flexible sub-layer formed to cover the strengthening layer, thereby embedding the strengthening layer.

Optionally, the first flexible sub-layer and the second flexible sub-layer are formed using a same flexible material.

Optionally, forming the strengthening layer comprises forming a metallic material layer on the first flexible sub-layer, and patterning the metallic material layer to form the strengthening layer.

Optionally, the method further comprises forming a barrier layer on a side of the second flexible sub-layer away from the first flexible sub-layer; and etching the flexible base substrate using the barrier layer as a mask plate to form the plurality of gaps in the flexible base substrate.

Optionally, the method further comprises forming a barrier layer on a side of the second flexible sub-layer away from the first flexible sub-layer; and patterning the first flexible sub-layer, the second flexible sub-layer, and the metallic material layer simultaneously using the barrier layer as a mask plate, thereby forming the strengthening layer and the plurality of gaps in the flexible base substrate in a single patterning process.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a flexible substrate, a display panel, and a method of fabricating a flexible substrate that substantially obviate one or more of the problems due to limitations and disadvantages of the related art. In one aspect, the present disclosure provides a flexible substrate. In some embodiments, the flexible substrate includes a flexible base substrate including a flexible material. Optionally, the flexible base substrate has a plurality of gaps and a plurality of solid non-gap portions. Optionally, at least two adjacent solid non-gap portions of the plurality of solid non-gap portions are interconnected. Optionally, the flexible base substrate includes a strengthening layer in the plurality of solid non-gap portions. Optionally, the strengthening layer includes a strengthening material having a Young's modulus greater than a Young's modules of the flexible material.

In some embodiments, a flexible substrate is an array substrate having a plurality of subpixels. The array substrate includes a base substrate, and a plurality of thin film transistors (TFT) formed on the base substrate for driving light emission respectively in the plurality of subpixels. In some embodiments, the base substrate is a flexible base substrate.

Figure 1:
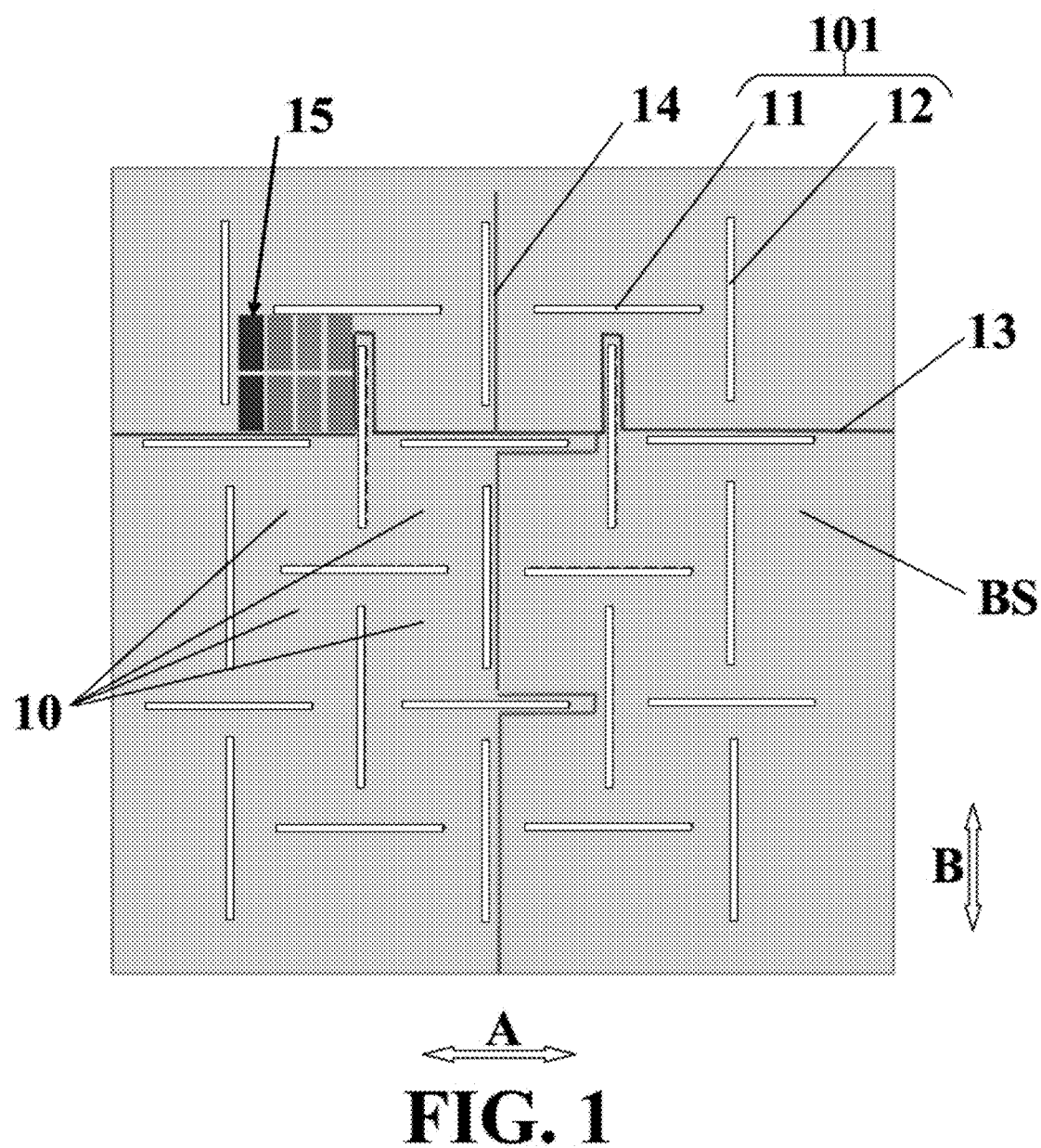
FIG. 1 is a plan view of a flexible substrate in some embodiments according to the present disclosure.

FIG. 1 is a plan view of a flexible substrate in some embodiments according to the present disclosure. Referring to FIG. 1, a flexible substrate includes a flexible base substrate BS including a flexible material. Optionally, the flexible substrate is a stretchable substrate.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

Various appropriate flexible materials may be used for forming the flexible base substrate BS. Examples of flexible materials suitable for forming the flexible base substrate BS include polyimide, polycarbonate, polyethersulfone, polyethylene terephthalate, polyethylene naphthalate, polyarylate, and fiber-reinforced plastic. Optionally, the flexible base substrate BS is a transparent base substrate. Optionally, the flexible base substrate BS is a non-transparent base substrate.

In some embodiment, the flexible base substrate BS has a plurality of gaps 101 and a plurality of solid non-gap portions 10. Optionally, at least two adjacent solid non-gap portions of the plurality of solid non-gap portions 10 are interconnected. Optionally, all of the plurality of solid non-gap portions 10 are interconnected. As shown in FIG. 1, in some embodiments, the flexible base substrate BS has a plurality of subpixel regions 15 in a respective one of the plurality of solid non-gap portions 10. Optionally, the flexible base substrate BS has a single subpixel region in the respective one of the plurality of solid non-gap portions 10.

In some embodiment, the plurality of gaps 101 include a plurality of first sub-gaps 11 and a plurality of second sub-gaps 12. Optionally, the plurality of first sub-gaps 11 are along a direction A as shown in FIG. 1. The plurality of second sub-gaps 12 are along a direction B as shown in FIG. 1. Optionally, the direction A is different from the direction B. In one example, an angle is formed between the direction A and direction B. In another example, the direction A is perpendicular to the direction B. Optionally, along the direction A, two adjacent first sub-gaps of the plurality of first sub-gaps 11 sandwich a respective one of the plurality of second sub-gaps 12. Optionally, along the direction B, two adjacent second sub-gaps of the plurality of second sub-gaps 12 sandwich a respective one of the plurality of first sub-gaps 11.

In some embodiments, the plurality of gaps 101 is formed by forming vias extending through the flexible substrate including the flexible base substrate BS. Optionally, the plurality of gaps 101 is formed by forming grooves partially extending into the flexible base substrate BS. For example, the grooves don't extend through the flexible base substrate BS.

In some embodiments, various appropriate shapes may be used to form the plurality of gaps. For example, a cross-section of a respective one of the plurality of gaps along a plane parallel to the flexible base substrate may have a diamond shape, a rectangular shape, a square shape, a triangular shape, or a polygonal shape.

In some embodiments, a respective one of the plurality of solid non-gap portions 10 is defined by one or more of the plurality of gaps 101. For example, a respective one of the plurality of solid non-gap portions 10 is substantially surrounded by one or more of the plurality of gaps 101. Optionally, at least two adjacent solid non-gap portions defined by multiple ones of the plurality of gaps 101 is interconnected. For example, at least two adjacent gaps of the plurality of gaps 101 are not connected with each other, the two adjacent solid non-gap portions defined by the two unconnected adjacent gaps are interconnected. Optionally, all the plurality of solid non-gap portions 10 are interconnected.

As used herein the term "substantially surround" refers to surround at least 50% (e.g., at least 60%, at least 70%, at least 80%, at least 90%, at least 95%, at least 99%, and 100%) of a perimeter of an area. For example, the strengthening layer 22 substantially surrounds the plurality of gaps 101 to prevent cracks of the plurality of gaps from extending to the plurality of solid non-gap portions.

In one example, the plurality of first sub-gaps 11 are in a direction perpendicular to a direction of the plurality of second sub-gaps 12. A respective one of the plurality of solid non-gap portions 10, defined by multiple ones of the plurality of first sub-gaps 11 and the plurality of second sub-gaps 12, may have a rectangular shape or a square shape. In another example, each one of the plurality of non-gap portions 10 has a same shape and a same size.

Figure 2:
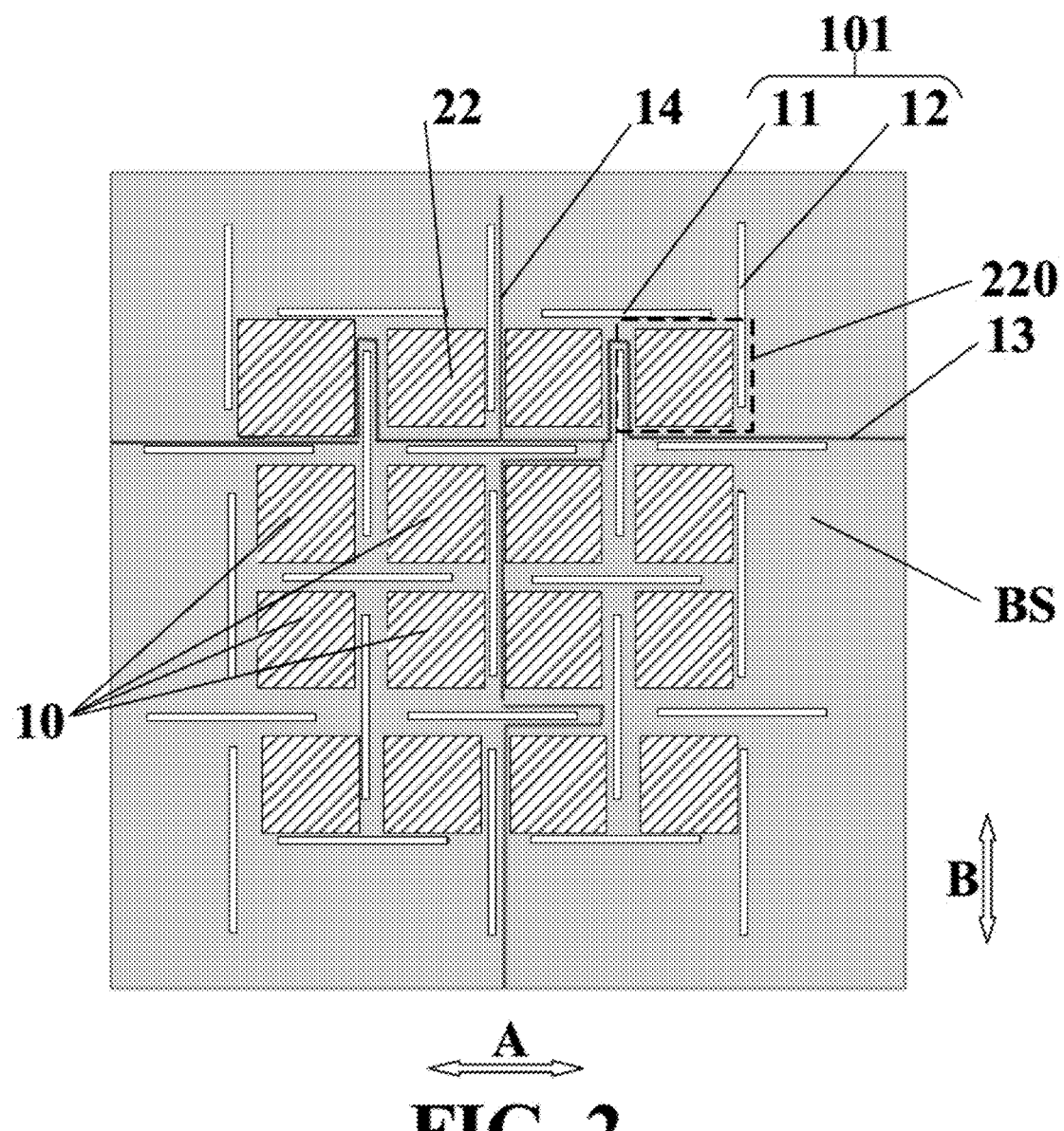
FIG. 2 is a plan view of a flexible substrate in some embodiments according to the present disclosure.
Figure 3A:
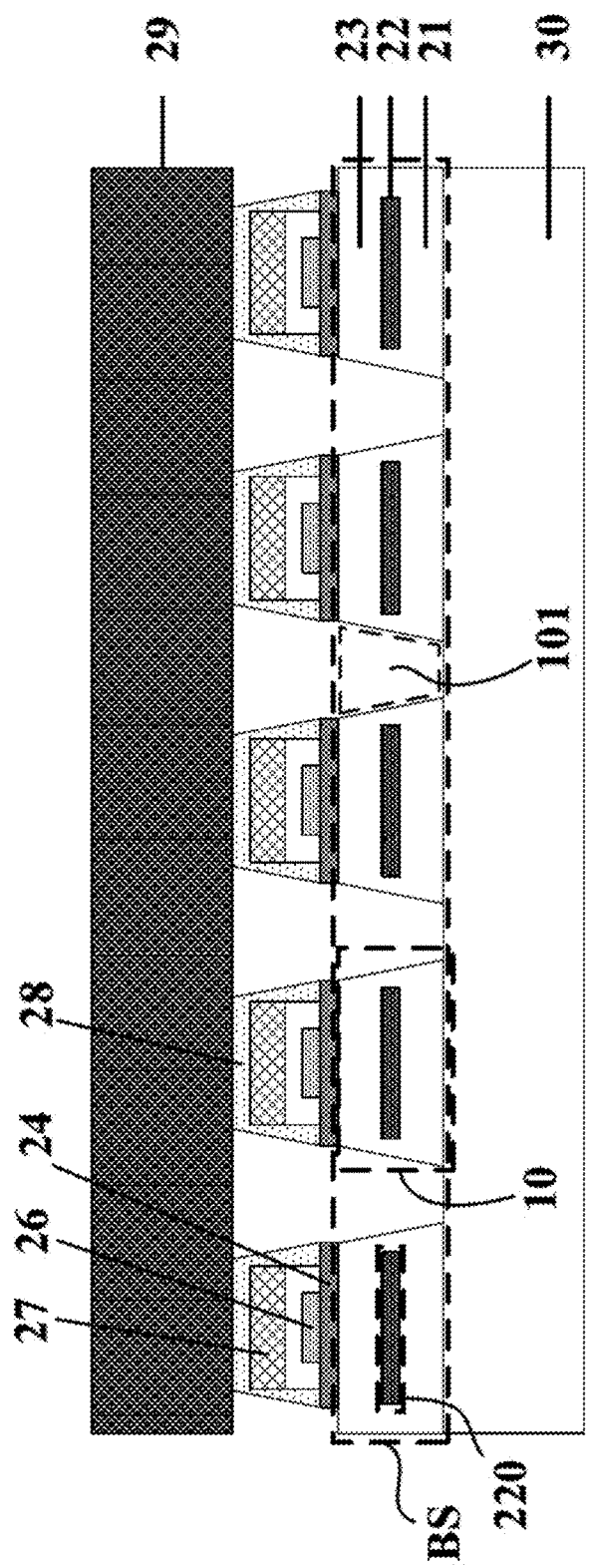
FIG. 3A is a cross-sectional view of a flexible substrate in some embodiments according to the present disclosure.

FIG. 2 is a plan view of a flexible substrate in some embodiments according to the present disclosure. FIG. 3A is a cross-sectional view of a flexible substrate in some embodiments according to the present disclosure. In some embodiments, referring to both FIG. 2 and FIG. 3A, the flexible base substrate BS includes a strengthening layer 22 in the plurality of solid non-gap portions 10.

Referring to FIG. 3A, in some embodiments, the flexible base substrate BS includes a flexible material. Optionally, the strengthening layer 22 is embedded in the flexible material. In some embodiments, the flexible base substrate BS includes a first flexible sub-layer 21 including a first flexible material and a second flexible sub-layer 23 including a second flexible material. Optionally, the first flexible material is the same as the second flexible material. Optionally, the first flexible material and the second flexible material are different from each other.

Optionally, the strengthening layer 22 includes strengthening material distributed in the first flexible sub-layer 21. Optionally, the strengthening layer 22 is between the first flexible sub-layer 21 and the second flexible sub-layer 23. For example, the flexible substrate includes a first flexible sub-layer 21, the second flexible sub-layer 23 and a strengthening layer 22 embedded between the first flexible sub-layer and the second flexible sub-layer. Optionally, the strengthening layer 22 substantially surrounds the plurality of gaps 101.

Optionally, the strengthening layer 22 includes a plurality of strengthening blocks 220 spaced apart from each other. Optionally, a respective one of the plurality of strengthening blocks 220 is in one of the plurality of solid non-gap portions 10. Optionally, adjacent strengthening blocks of the plurality of strengthening blocks 220 are spaced apart from each other. Optionally, two or more of the plurality of strengthening blocks 220 are interconnected.

Optionally, the strengthening layer 22 is floating. In one example, the strengthening layer 22 is not electrically connected to other components in the flexible substrate. Optionally, each individual one of the plurality of strengthening blocks 220 is floating. In one example, each individual one of the plurality of strengthening blocks 220 is not electrically connected to other one of the plurality of strengthening blocks 220. In another example, each individual one of the plurality of strengthening blocks 220 is not electrically connected to other components in the display substrate. As used herein the term "floating" refers to a component is not electrically connected to other components.

Optionally, the strengthening layer 22 includes a strengthening material having a Young's modulus greater than a Young's modules of the flexible material (e.g., the flexible material of the first flexible sub-layer 21 and the second flexible sub-layer 23). Various appropriate strengthening materials may be used for forming the strengthening layer 22. Examples of strengthening materials include, but are not limited to, various metals, various alloys, carbon nanotubes, graphene, and so on. In one example, the strengthening layer includes a metallic material. The metallic material includes extensible metals. For example, the metallic materials includes titanium, aluminum, and silver.

A respective one of the plurality of strengthening blocks 220 may be formed to have various appropriate shapes. Examples of shapes suitable for the respective one of the plurality of strengthening blocks 220 include, but are not limited to, a ring shape, a circular shape, a rectangular shape, and a square shape.

In some embodiments, a respective one of the plurality of gaps 101 has an elongated shape having a longitudinal direction and a lateral direction. One of the plurality of strengthening blocks 220 is disposed in one of the plurality of solid non-gaps portions 10 adjacent to the respective one of the plurality of gaps 101. Optionally, one end of the elongated shape along the longitudinal direction is substantially aligned with one end of the one of the plurality of strengthening blocks 220 in one of the plurality of solid non-gaps portions 10 adjacent to the respective one of the plurality of gaps 101. Optionally, one end of the elongated shape along the longitudinal direction is misaligned with one end of the one of the plurality of strengthening blocks 220 in one of the plurality of solid non-gaps portions 10 adjacent to the respective one of the plurality of gaps 101.

In some embodiments, the flexible substrate can be easily stretched due to the presence of the plurality of gaps on the flexible substrate. Optionally, the flexible substrate is made of flexible materials including polyimide to make the flexible substrate more flexible. Accordingly, the regions corresponding to the plurality of gaps are more flexible to accommodate the stretching action. After repeated stretching, cracks may occur on regions surrounding the plurality of gaps on the flexible substrate, and may propagate into the plurality of solid non-gap portions. Typically, a plurality of subpixels are formed in the plurality of solid non-gap portions. To prevent damages to the plurality of subpixels, measures should be taken to prevent the cracks from propagating into the plurality of solid non-gap portions.

In some embodiments, the plurality of gaps is substantially surrounded by strengthening materials having a Young's modulus greater than a Young's modulus of the flexible material. In one example, the plurality of gaps can withstand repeated and strenuous stretching without forming any cracks in regions surrounding the plurality of gaps. In another example, the strengthening material surrounding the plurality of gaps prevents the cracks from propagating through the strengthening into the plurality of solid non-gaps portions.

Referring to FIG. 3A, in some embodiments, the flexible base substrate further includes a barrier layer 24 on the plurality of solid non-gap portions 10 of the flexible base substrate BS. Optionally, an orthographic projection of the barrier layer 24 on the flexible base substrate BS covers the strengthening layer 22.

In another aspect, the present disclosure provides a display panel. In some embodiments, the display panel includes the flexible substrate describe herein or fabricated by a method described herein. Optionally, the display panel is a stretchable display panel. Optionally, the display panel is an organic light emitting diode display panel.

Referring to FIG. 3A, in some embodiments, the display panel include a flexible base substrate BS including a flexible material, a strengthening layer embedded in the flexible material, and a barrier layer. Optionally, the display panel further includes a plurality of thin film transistors 26 on side of the barrier layer away from the flexible base substrate BS. Optionally, the display panel further includes a plurality of light emitting elements 27 on a side of the plurality of thin film transistors 26 away from the flexible base substrate BS. Optionally, the display panel further includes an encapsulating layer 28 on a side of the plurality of light emitting elements 27 away from the flexible base substrate BS. Optionally, the display panel further includes a back film 30 on a side of the flexible base substrate BS away from the plurality of light emitting elements 27.

Optionally, the plurality of light emitting elements 27 are on the plurality of the solid non-gap portions 10 of the flexible base substrate BS. Optionally, a respective one of the plurality of light emitting elements 27 includes at least one sub-pixel of the plurality of sub-pixels. A respective one of the plurality of sub-pixels corresponds to one of the plurality of thin film transistor. Optionally, the plurality of sub-pixels are made of organic electroluminescent materials.

Optionally, the barrier layer 24 is disposed on the plurality of solid non-gap portions 10 of the flexible base substrate BS. Optionally, the plurality of light emitting elements 27 are disposed on a side of the barrier layer 24 away from the flexible base substrate BS.

Optionally, the encapsulating layer 28 encapsulates both the plurality of light emitting elements 27 and the plurality of thin film transistors 26 on the plurality of solid non-gap portions 10 of the flexible base substrate BS.

Optionally, the back film 30 has a stretchability equal to or less than a stretchability of a remainder of the display panel. As used herein, the term stretchability is defined by the following relationship: stretchability=((final dimension−initial dimension)/initial dimension)×100%. The remainder of the display panel refers to layers of the display panel other than the back film 30.

Optionally, referring to FIG. 1, the plurality of solid non-gap portions 10 are disposed in array along the direction A. The plurality of solid non-gap portions 10 are disposed in array along the direction B. Referring to FIG. 3A, at least one of the plurality of thin film transistors 26 is formed on one of the plurality of solid non-gap portions 10. In one example, the plurality of thin film transistors 26 is disposed in array. The flexible substrate having the plurality of thin film transistors 26 is called flexible array substrate.

Optionally, referring to FIG. 1, the display panel further includes a plurality of gate lines 13, and a plurality of data lines 14, on the plurality of solid non-gap portions 10 of the flexible base substrate BS.

Optionally, a respective one of the plurality of gate lines 13 is connected to a row of thin film transistors of the array of the plurality of thin film transistors 26 along the direction A. Optionally, a respective one of the plurality of data lines 14 is connected to a column of thin film transistors 26 of the array of the plurality of thin film transistors 26 along the direction B. In one example, the respective one of the plurality of gate lines 13 extends through regions corresponding to multiple interconnected solid non-gap portions of the plurality of solid non-gap portions 10 along a row direction (e.g. direction A) of the array of the plurality of thin film transistors 26. In another example, the respective one of the plurality of data lines 14 extends through regions corresponding to multiple interconnected solid non-gap portions of the plurality of solid non-gap portions along a column direction (e.g. direction B) of the array of the plurality of thin film transistors 26.

For example, referring to FIG. 1 and FIG. 3A, in some embodiments, a row of the plurality of thin film transistors 26 along the direction A shares a same gate line 13. A column of the plurality of thin film transistors 26 along the direction B shares a same data line 14 (e.g. source/drain line).

Figure 3B:
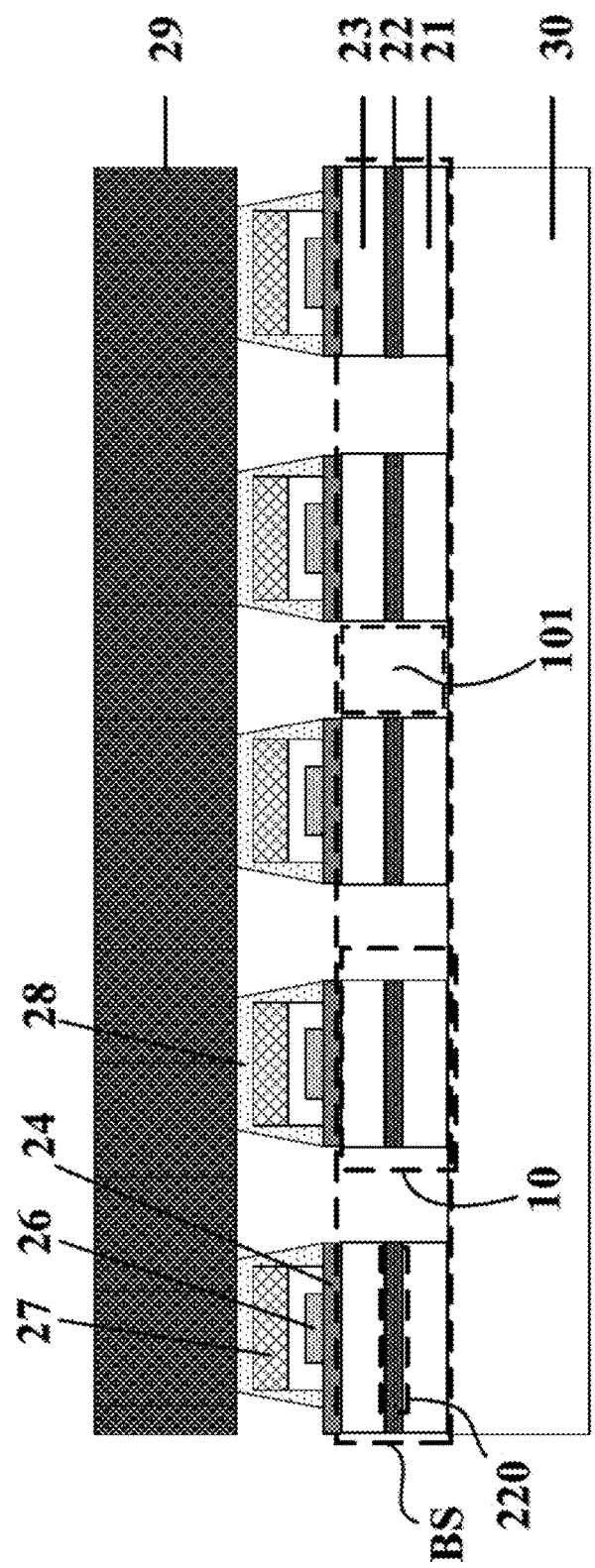
FIG. 3B is a cross-sectional view of a flexible substrate in some embodiments according to the present disclosure.

FIG. 3B is a cross-sectional view of a flexible substrate in some embodiments according to the present disclosure. The structure of the flexible substrate in FIG. 3B is largely similar to that depicted in FIG. 3A. As shown in FIG. 3B, in some embodiments, at least a portion of a periphery of the strengthening layer 22 is exposed to the plurality of gaps 101. By having the strengthening layer 22 exposed to the plurality of gaps 101, the strengthening layer 22 can better prevent cracks from extending to the plurality of solid non-gap portions 10, making the flexible substrate more resistant to moist and oxygen. Optionally, the strengthening layer 22 includes a plurality of strengthening blocks 220 (either spaced apart from each other or interconnected). Optionally, at least a portion of a periphery of a respective one of the plurality of strengthening blocks 220 is exposed to one or more of the plurality of gaps 101. Optionally, substantially an entirety of the periphery of the respective one of the plurality of strengthening blocks 220 is exposed to one or more of the plurality of gaps 101.

Referring to FIG. 3B, in some embodiments, an orthographic projection of the barrier layer 24 on the flexible base substrate BS substantially overlaps with an orthographic projection of the strengthening layer 22 on the flexible base substrate BS. Optionally, the orthographic projection of the barrier layer 24 on the back film 30 substantially overlaps with the orthographic projection of the strengthening layer 22 on the back film 30. As used herein, the term "substantially overlap" refers to two orthographic projections at least 50%, e.g., at least 60%, at least 70%, at least 80%, at least 90%, at least 95%, at least 99%, overlapping with each other. Optionally, the strengthening layer 22 extends throughout the plurality of solid non-gap portions 10, e.g., has substantially the same area as that of the plurality of solid non-gap portions 10. Optionally, the strengthening layer 22 has substantially the same area as that of the barrier layer 24. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

Figure 4:
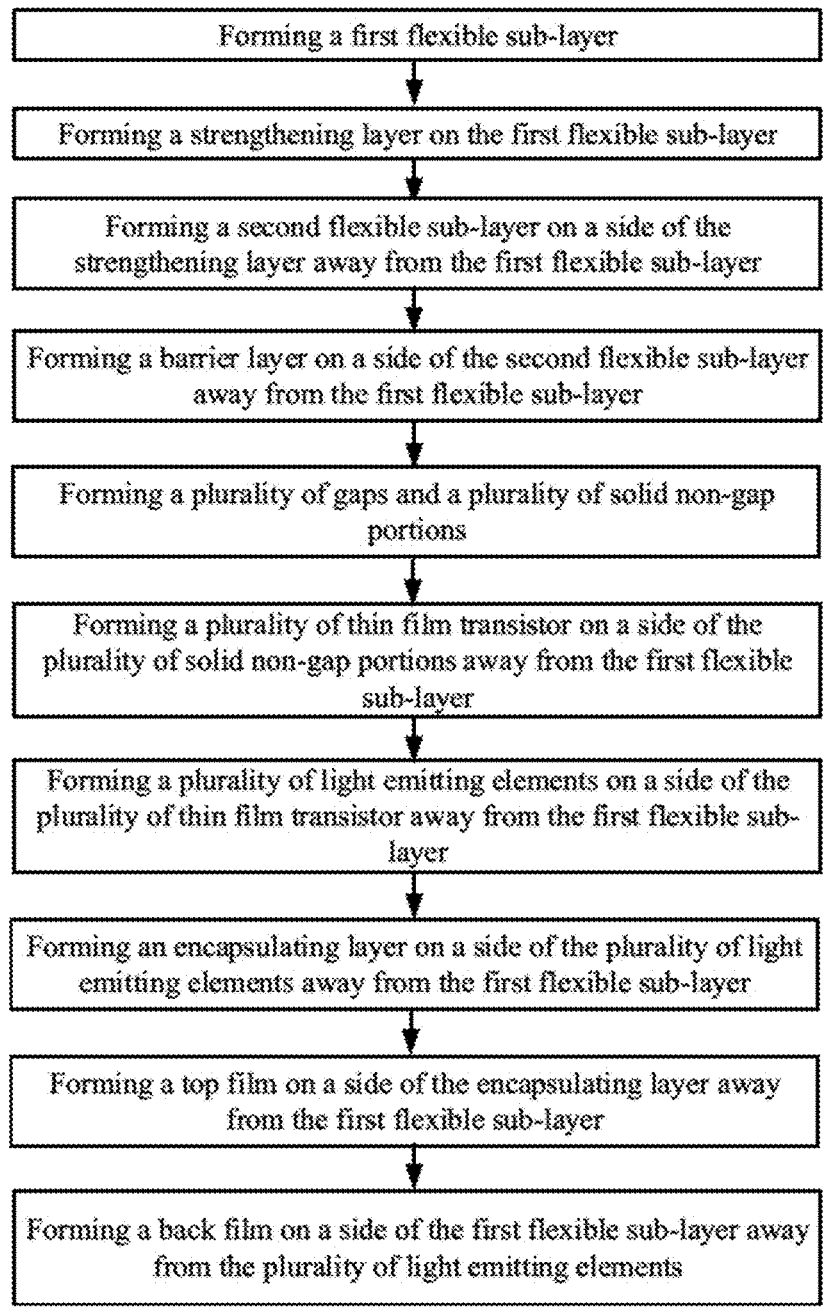
FIG. 4 is a flow chart illustrating a method of fabricating a flexible substrate in some embodiments according to the present disclosure.

In another aspect, the present disclosure provides a method of fabricating a flexible substrate. FIG. 4 is a flow chart illustrating a method of fabricating a flexible substrate in some embodiments according to the present disclosure. Referring to FIG. 4, in some embodiments, a method of fabricating a flexible substrate includes forming a flexible base substrate including a flexible material.

In some embodiments, forming the flexible base substrate includes forming a first flexible sub-layer; forming a strengthening layer on the first flexible sub-layer; and forming a second flexible sub-layer on a side of the strengthening layer away from the first flexible sublayer. Optionally, the second flexible sub-layer is formed to cover the strengthening layer, which embeds the strengthening layer in the flexible base substrate. Optionally, the strengthening layer is formed to include a strengthening material having a Young's modulus greater than a Young's modules of the flexible material. Optionally, the first flexible sub-layer and the second flexible sub-layer are formed using a same flexible material.

Optionally, forming the strengthening layer includes forming a metallic material layer on the first flexible sub-layer, and patterning the metallic material layer to form the strengthening layer.

In some embodiments, forming the flexible base substrate further includes forming a barrier layer on a side of the second flexible sub-layer away from the first flexible sub-layer; and etching the flexible base substrate using the barrier layer as a mask plate to form a plurality of gaps in the flexible base substrate. Optionally, the barrier layer is formed so that an orthographic projection of the barrier layer on the flexible base substrate covers the strengthening layer.

Subsequent to forming the plurality of gaps in the flexible base substrate, a plurality of solid non-gap portions are formed in the flexible base substrate. Optionally, at least two adjacent solid non-gap portions of the plurality of solid non-gap portions is formed to be interconnected. Optionally, the strengthening layer is formed in the plurality of solid non-gap portions.

In some embodiments, the method of fabricating a flexible substrate further includes forming a plurality of thin film transistor on a side of the plurality of solid non-gap portions away from the first flexible sub-layer; forming a plurality of light emitting elements on a side of the plurality of thin film transistor away from the first flexible sub-layer; forming an encapsulating layer on a side of the plurality of light emitting elements away from the first flexible sub-layer to encapsulate the plurality of thin film transistor and the plurality of light emitting elements; forming a top film on a side of the encapsulating layer away from the first flexible sub-layer, and forming a back film on a side of the first flexible sub-layer away from the plurality of light emitting elements.

Figure 5A:
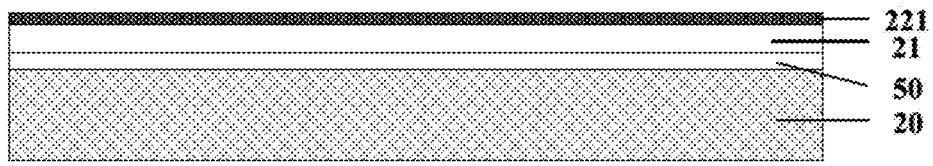
FIG. 5A to FIG. 5J are schematic diagrams illustrating a method of fabricating a flexible substrate in some embodiments according to the present disclosure.

FIG. 5A to FIG. 5J are schematic diagrams illustrating a method of fabricating a flexible substrate in some embodiments according to the present disclosure. Referring to FIG. 5A, in some embodiments, the method of fabricating a flexible substrate includes forming a first flexible sub-layer 21 on a mother substrate 20. Optionally, the mother substrate 20 is a glass substrate. The mother substrate 20 can be removed from the first flexible sub-layer 21. For example, a partial separation layer 50 is disposed on the mother substrate 20, facilitating the separation of the mother substrate 20 from the first flexible sub-layer 21. The partial separation layer 50 may be made of various appropriate separation materials, e.g., silicon nitride or molybdenum.

Optionally, the first flexible sub-layer 21 is made of a first flexible material having a first Young's modulus. For example, the first flexible material is polyimide. Optionally, the thickness of the first flexible sub-layer 21 is in a range approximately 3 μm to approximately 10 μm, e.g. approximately 3 μm to approximately 5 μm, approximately 5 μm to approximately 7 μm, approximately 7 μm to approximately 9 μm, and approximately 9 μm to approximately 10 μm.

Referring to FIG. 5A, a strengthening material layer 221 is formed on a side of the first flexible sub-layer 21 away from the mother substrate 20.

In some embodiments, the method of forming a flexible substrate further includes forming a plurality of gaps and a strengthening layer. Optionally, the plurality of gaps is configured to define a plurality of solid non-gap portions. And at least two adjacent solid non-gap portions of the plurality of solid non-gap portions are interconnected. Optionally, the strengthening layer 22 is made of strengthening material with a second Young's modulus. Optionally, the second Young's modulus is greater than the first Young's modulus.

Figure 5B:
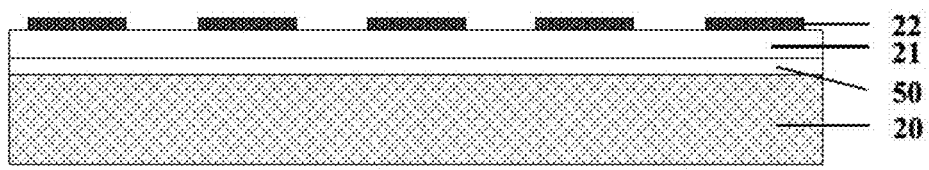

In some embodiments, referring to FIG. 5B, the method of forming a flexible substrate further includes forming a strengthening layer 22 on a side of the first flexible sub-layer 21 using a strengthening material. Optionally, forming the strengthening layer 22 includes patterning the metallic material layer 221 to form the strengthening layer 22. For example, the metallic material layer 211 can be formed using atomic layer deposition (ALD).

Various strengthening materials may be used for making the strengthening layer 22. Examples of strengthening materials suitable for making the strengthening layer 22 includes, but are not limited to, titanium, aluminum, and silver.

Various appropriate methods may be used for patterning the strengthening material layer. Examples of methods suitable for patterning the strengthening material layer include, but are not limited to, sputtering, photolithography, and etching.

Figure 5C:
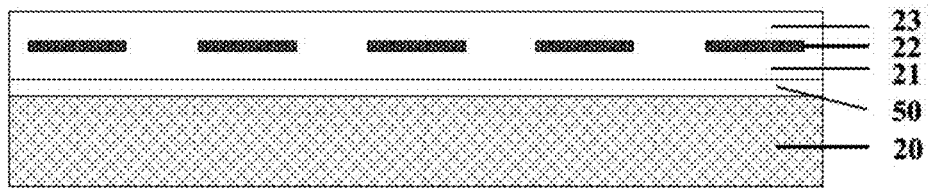

In some embodiments, referring to FIG. 5C, the method of forming a flexible substrate further includes forming a second flexible sub-layer 23 on a side of the strengthening layer 22 away from the first flexible sub-layer 21. In one example, the second flexible sub-layer 23 is made of polyimide. In another example the thickness of the second flexible sub-layer 23 is in a range approximately 3 μm to approximately 10 μm, e.g. approximately 3 μm to approximately 5 μm, approximately 5 μm to approximately 7 μm, approximately 7 μm to approximately 9 μm, and approximately 9 μm to approximately 10 μm.

Optionally, an orthographic projection of the strengthening layer 22 on the first flexible sub-layer 21 partially covers the first flexible sub-layer 21. An orthographic projection of the second flexible sub-layer 23 on the first flexible sub-layer 21 covers the first flexible sub-layer 21. The orthographic projection of the second flexible sub-layer 23 on the first flexible sub-layer 21 covers the orthographic projection of the strengthening layer 22 on the first flexible sub-layer 21.

Figure 5D:
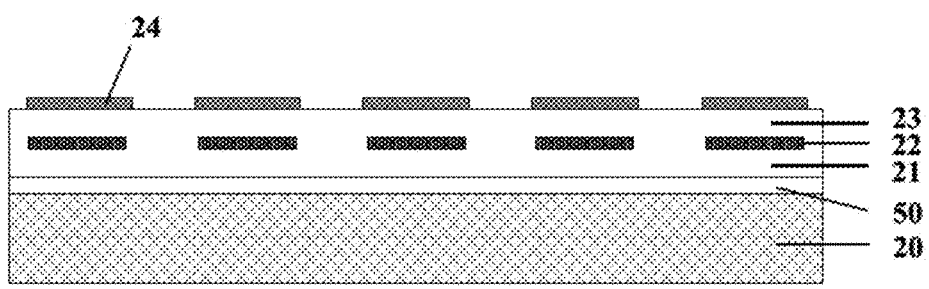

In some embodiments, referring to FIG. 5D, the method of forming a flexible substrate further includes forming a barrier layer 24 on a side of the second flexible sub-layer 23 away from the first flexible sub-layer 21. Optionally, the pattern of the barrier layer 24 is formed using patterning and etching. Optionally, an orthographic projection of the barrier layer 24 on the first flexible sub-layer 21 covers the orthographic projection of the strengthening layer 22 on the first flexible sub-layer 21. For example, an opening of the barrier layer 24 has a smaller size than an opening of the strengthening layer 22. Optionally, the same mask plate for patterning the strengthening layer 22 can be used for patterning the barrier layer 24.

Figure 5E:
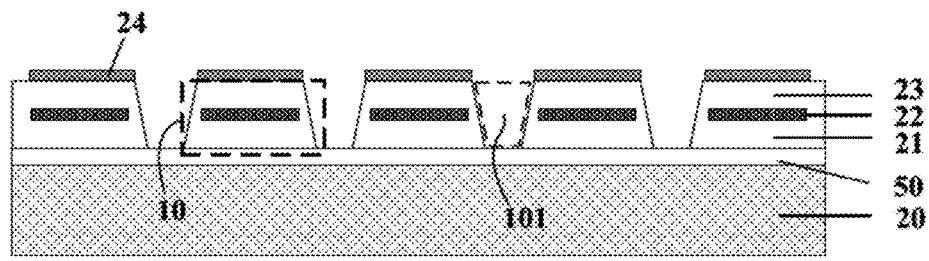

In some embodiments, referring to FIG. 5E, the method of forming a flexible substrate further includes etching the first flexible sub-layer 21 and the second flexible sub-layer 23 via the opening of the barrier layer 24 to form a plurality of gaps 101. The plurality of gaps 101 are stretchable to make a substrate a flexible substrate. For example, subsequent to forming the plurality of gaps 101, the strengthening layer 22 forms a strengthening region substantially surrounding the plurality of gaps 101. And the remaining portion of the first flexible sub-layer 21 and the second flexible sub-layer 23 forms the plurality of solid non-gap portions 10.

Optionally, the barrier layer 24 is made of metallic materials. Optionally, a metallic material layer 240 is formed on a side of the second flexible sub-layer 23 away from the first flexible sub-layer 21. The metallic material layer 240 is patterned to form the barrier layer 24. In some example, an orthographic projection of the barrier layer 24 on the first flexible sub-layer 21 covers the orthographic projection of the strengthening layer 22 on the first flexible sub-layer 21. In another example, the orthographic projection of the barrier layer 24 on the first flexible sub-layer 21 has a size equal or greater than the size of the orthographic projection of the strengthening layer 22 on the first flexible sub-layer 21, which may prevent the strengthening layer 22 from being etched. Optionally, the strengthening layer 22 can also be used as a mask plate during the etching of both the first flexible sub-layer 21 and the second flexible sub-layer 23.

Figure 5F:
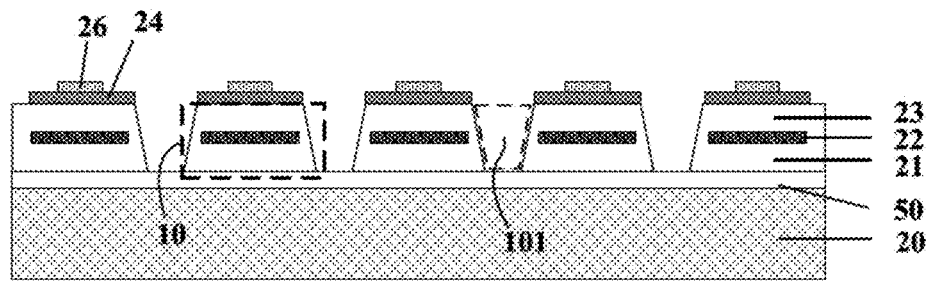

In some embodiments, referring to FIG. 5F, the method of forming a flexible substrate further includes keeping the barrier layer 24 on the second flexible sub-layer 23; and forming a plurality of thin film transistor 26, a plurality of gate lines and a plurality of data lines on a side of the barrier layer 24 corresponding to the plurality of solid non-gap portions 10 to form an array substrate.

Figure 5G:
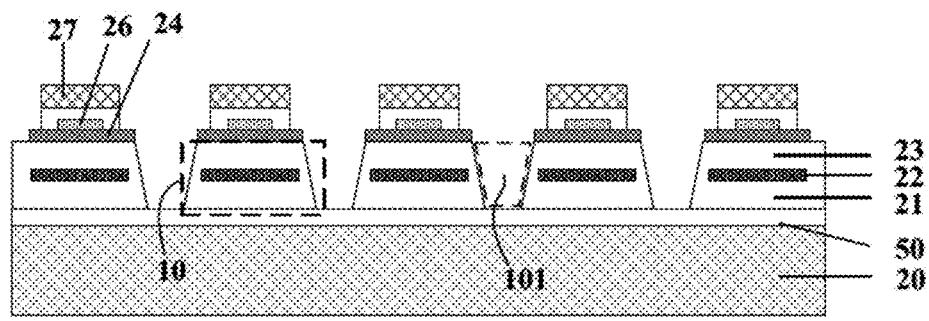

In some embodiments, referring to FIG. 5G, the method of forming a flexible substrate further includes forming a plurality of light emitting elements 27 on a side of the thin film transistors away from the first flexible sub-layer 21. Optionally, a respective one of a plurality of light emitting elements 27 is formed on a side of one of the plurality of thin film transistors 26 corresponding to one of the plurality of solid non-gap portions 10. Optionally, one of the plurality of light emitting elements 27 includes an anode, a cathode, and light emitting materials. Optionally, a respective one of the plurality of light emitting elements 27 on one of the plurality of thin film transistors 26 correspond to one of a plurality of sub-pixels.

Figure 5H:
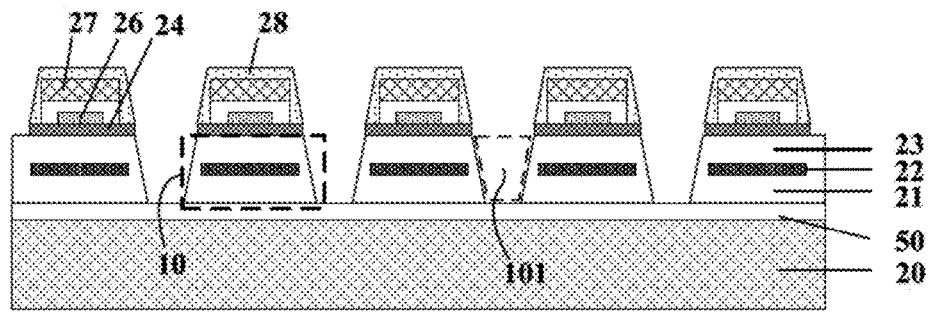

In some embodiments, referring to FIG. 5H, the method of forming a flexible substrate further includes encapsulating both the plurality of thin film transistors 26 and the plurality of light emitting elements 27. Optionally, an encapsulating layer 28 is formed on a side of the plurality of light emitting elements 27 away from the first flexible sub-layer 21 to encapsulate the plurality of thin film transistors 26 and the plurality of light emitting elements 27. Optionally, the barrier layer 24 can also be an encapsulating layer to encapsulate both the plurality of thin film transistors 26 and the plurality of light emitting elements 27 from a side of the plurality of thin film transistors 26 facing the first flexible sub-layer 21.

Figure 5I:
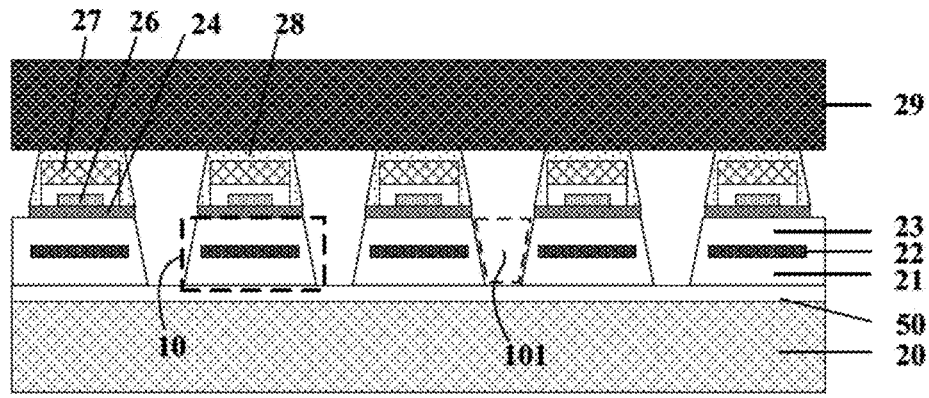

In some embodiments, referring to FIG. 5I, the method of forming a flexible substrate further includes forming a top film 29 on a side of the encapsulating layer 28 away from the first flexible sub-layer 21.

Figure 5J:
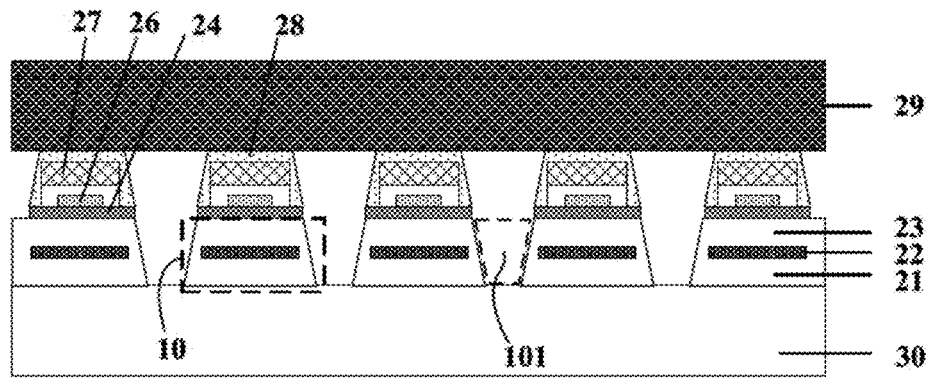

In some embodiments, referring to FIG. 5J, the method of forming a flexible substrate further includes removing the mother substrate 20; and forming a back film 30 on a side of the first flexible sub-layer 21 away from the plurality of light emitting elements 27. Optionally, referring to FIG. 5I, a buffer layer 40 between the mother substrate 20 and the first flexible sub-layer 21 can be dissolved using Laser Lift-off (LLO) and the mother substrate 20 can be removed from a side of the first flexible sub-layer 21 away from the plurality of thin film transistors 26.

Optionally, the back film 30 has a stretchability equal to or less than a stretchability of a remainder of the display panel. For example, the display panel can be stretched to has a size 20% greater than a unstretched size of the display panel. The back film 30 can be stretched to has a size 10% to 15% greater than a unstretched size of the back film 30. The back film 30 may protect the display penal and prevent the display panel from being overly stretched.

In some embodiments, a flexible substrate, an array substrate, and a display apparatus fabricated using the method of fabricating a flexible substrate described herein have the strengthening layer. The strengthening material of the strengthening layer is stronger than the flexible materials of the flexible substrate, the strengthening layer may prevent the cracks from extending to the plurality of solid non-gap portions. Optionally, the plurality of gaps may provide a larger amount of deformation. For example, the flexible substrate can also provide a large amount of deformation for a non-planar display. In some embodiments, a strengthening layer (e.g. metallic layer) may also be a moisture barrier, which can improve the quality of the encapsulation in a display apparatus. In some embodiments, a flexible base substrate is formed by two flexible sub-layers, and a strengthening layer embedded into the two flexible sub-layers, which may improve the tensile resistance of the flexible base substrate.

FIG. 6A to FIG. 6I are schematic diagrams illustrating a method of fabricating a flexible substrate in some embodiments according to the present disclosure. Referring to FIG. 5A, in some embodiments, the method of fabricating a flexible substrate includes forming a first flexible sub-layer 21 on a mother substrate 20; and forming a strengthening material layer 221 on a side of the first flexible sub-layer 21 away from the mother substrate 20. Optionally, the mother substrate 20 is a glass substrate. The mother substrate 20 can be removed from the first flexible sub-layer 21. For example, a partial separation layer 50 is disposed on the mother substrate 20, facilitating the separation of the mother substrate 20 from the first flexible sub-layer 21. The partial separation layer 50 may be made of various appropriate separation materials, e.g., silicon nitride or molybdenum.

Figure 6A:
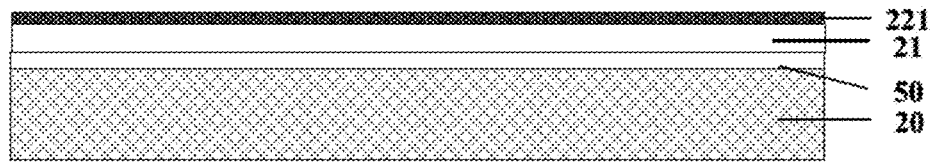
FIG. 6A to FIG. 6I are schematic diagrams illustrating a method of fabricating a flexible substrate in some embodiments according to the present disclosure.
Figure 6B:
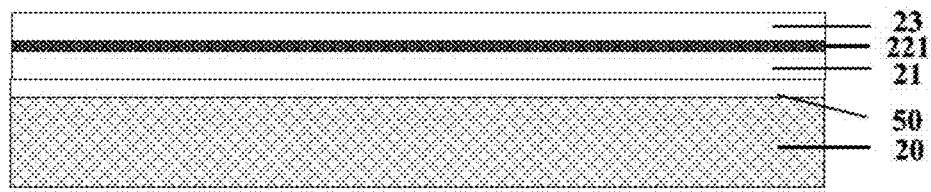

Referring to FIG. 6B, without patterning the strengthening material layer 221, a second flexible sub-layer 23 is formed on a side of the strengthening material layer 221 away from the first flexible sub-layer 21. In one example, the second flexible sub-layer 23 is made of polyimide. In another example the thickness of the second flexible sub-layer 23 is in a range approximately 3 μm to approximately 10 μm, e.g. approximately 3 μm to approximately 5 μm, approximately 5 µm to approximately 7 µm, approximately 7 µm to approximately 9 µm, and approximately 9 µm to approximately 10 µm.

Figure 6C:
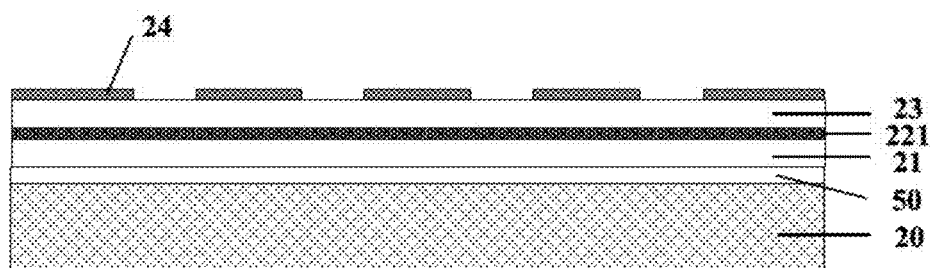

Referring to FIG. 6C, the method of forming a flexible substrate further includes forming a barrier layer 24 on a side of the second flexible sub-layer 23 away from the first flexible sub-layer 21.

Figure 6D:
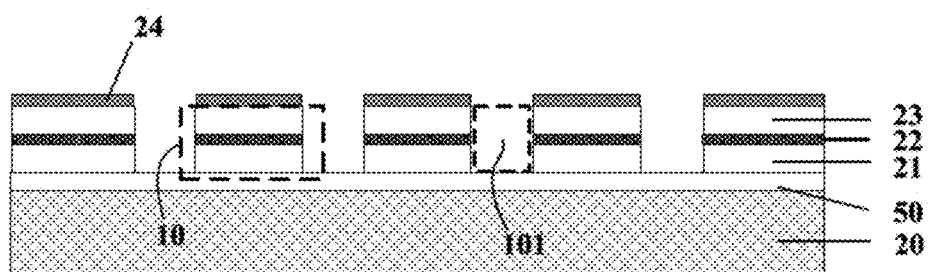

Referring to FIG. 6D, the method of forming a flexible substrate further includes patterning the first flexible sub-layer 21, the second flexible sub-layer 23, and the metallic material layer 221 simultaneously using the barrier layer 24 as a mask plate, thereby forming the strengthening layer 22 and the plurality of gaps 101 in the flexible base substrate in a single patterning process. The strengthening layer 22 is formed so that at least a portion of a periphery of the strengthening layer 22 is exposed to the plurality of gaps 101. Optionally, the strengthening layer 22 is formed so that substantially an entirety of the periphery of the strengthening layer 22 is exposed to the plurality of gaps 101. Optionally, the strengthening layer 22 is formed to include a plurality of strengthening blocks 220 (either spaced apart from each other or interconnected). Optionally, the strengthening layer 22 is formed so that at least a portion of a periphery of a respective one of the plurality of strengthening blocks 220 is exposed to one or more of the plurality of gaps 101. Optionally, the strengthening layer 22 is formed so that substantially an entirety of the periphery of the respective one of the plurality of strengthening blocks 220 is exposed to one or more of the plurality of gaps 101. Optionally, the strengthening layer 22 is formed so that an orthographic projection of the barrier layer 24 on the flexible base substrate substantially overlaps with an orthographic projection of the strengthening layer 22 on the flexible base substrate. Optionally, the strengthening layer 22 is formed so that the orthographic projection of the barrier layer 24 on the mother substrate 20 substantially overlaps with the orthographic projection of the strengthening layer 22 on the mother substrate 20. Optionally, the strengthening layer 22 is formed to extend throughout the plurality of solid non-gap portions 10, e.g., has substantially the same area as that of the plurality of solid non-gap portions 10. Optionally, the strengthening layer 22 is formed to have substantially the same area as that of the barrier layer 24.

Figure 6E:
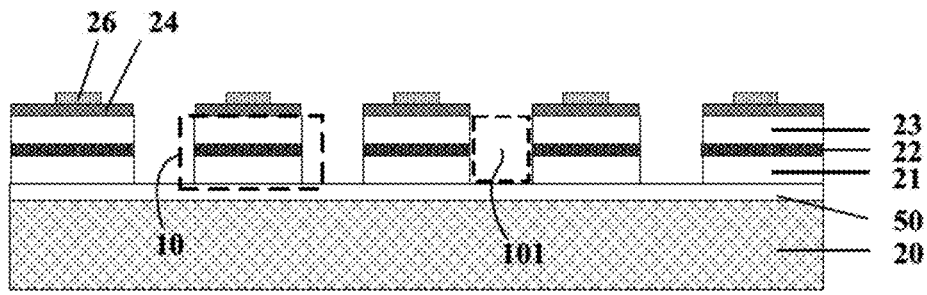

Referring to FIG. 6E, the method of forming a flexible substrate further includes forming a plurality of thin film transistor 26, a plurality of gate lines and a plurality of data lines on a side of the barrier layer 24 corresponding to the plurality of solid non-gap portions 10, thereby forming an array substrate.

Figure 6F:
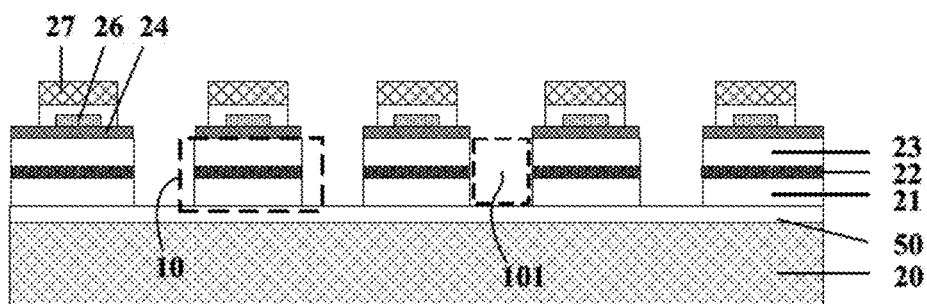

Referring to FIG. 6F, the method of forming a flexible substrate further includes forming a plurality of light emitting elements 27 on a side of the thin film transistors away from the first flexible sub-layer 21. Optionally, a respective one of a plurality of light emitting elements 27 is formed on a side of one of the plurality of thin film transistors 26 corresponding to one of the plurality of solid non-gap portions 10. Optionally, one of the plurality of light emitting elements 27 includes an anode, a cathode, and light emitting materials. Optionally, a respective one of the plurality of light emitting elements 27 on one of the plurality of thin film transistors 26 correspond to one of a plurality of sub-pixels.

Figure 6G:
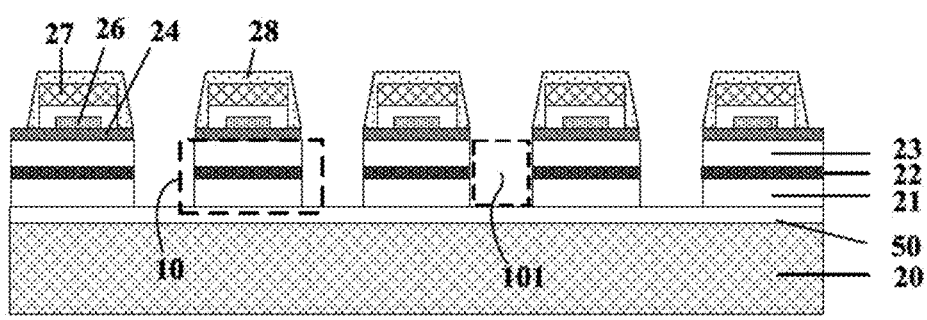

Referring to FIG. 6G, the method of forming a flexible substrate further includes encapsulating both the plurality of thin film transistors 26 and the plurality of light emitting elements 27. Optionally, an encapsulating layer 28 is formed on a side of the plurality of light emitting elements 27 away from the first flexible sub-layer 21 to encapsulate the plurality of thin film transistors 26 and the plurality of light emitting elements 27. Optionally, the barrier layer 24 can also be an encapsulating layer to encapsulate both the plurality of thin film transistors 26 and the plurality of light emitting elements 27 from a side of the plurality of thin film transistors 26 facing the first flexible sub-layer 21.

Figure 6H:
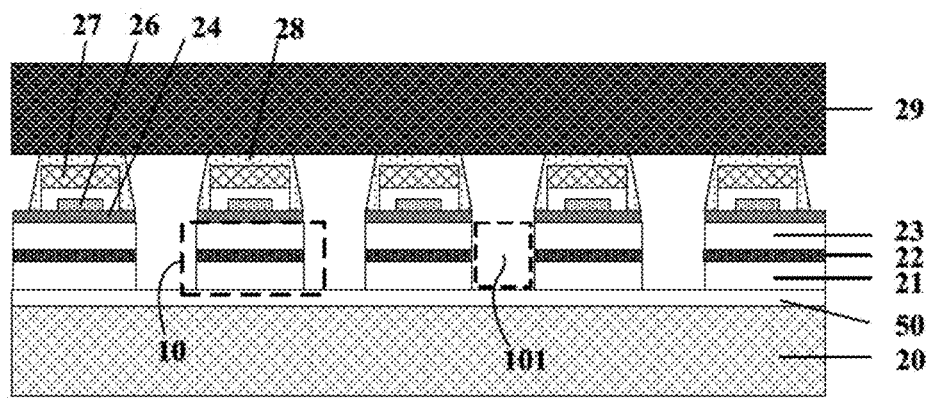

Referring to FIG. 6H, the method of forming a flexible substrate further includes forming a top film 29 on a side of the encapsulating layer 28 away from the first flexible sub-layer 21.

Figure 6I:
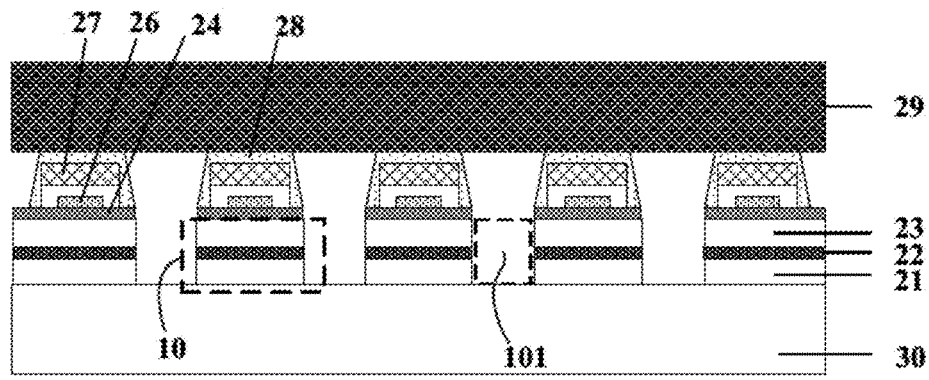

Referring to FIG. 6I, the method of forming a flexible substrate further includes removing the mother substrate 20; and forming a back film 30 on a side of the first flexible sub-layer 21 away from the plurality of light emitting elements 27. Optionally, referring to FIG. 5I, a buffer layer 40 between the mother substrate 20 and the first flexible sub-layer 21 can be dissolved using Laser Lift-off (LLO), and the mother substrate 20 can be removed from a side of the first flexible sub-layer 21 away from the plurality of thin film transistors 26.

In another aspect, the present disclosure also provides a display panel containing the flexible display substrate described herein. Optionally, the display panel is a liquid crystal display panel. Optionally, the display panel is an organic light emitting diode display panel.

In another aspect, the present disclosure also provides a display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible substrate, comprising a flexible base substrate comprising a flexible material;
   wherein the flexible base substrate has a plurality of gaps and a plurality of solid non-gap portions, at least two adjacent solid non-gap portions of the plurality of solid non-gap portions being interconnected; and
   the flexible base substrate comprises a strengthening layer in the plurality of solid non-gap portions, the strengthening layer comprising a strengthening material having a Young's modulus greater than a Young's modules of the flexible material.

2. The flexible substrate of claim 1, wherein the strengthening layer is embedded in the flexible material.

3. The flexible substrate of claim 1, further comprising a barrier layer on the plurality of solid non-gap portions of the flexible base substrate.

4. The flexible substrate of claim 3, wherein an orthographic projection of the barrier layer on the flexible base substrate substantially overlaps with an orthographic projection of the strengthening layer on the flexible base substrate.

5. The flexible substrate of claim 1, wherein the strengthening layer comprises a metallic material.

6. The flexible substrate of any one of claim 1, wherein at least a portion of a periphery of the strengthening layer is exposed to the plurality of gaps.

7. The flexible substrate of claim 1, wherein the flexible substrate is a stretchable substrate.

8. The flexible substrate of claim 1, wherein the strengthening layer comprises a plurality of strengthening blocks spaced apart from each other, a respective one of which being in a respective one of the plurality of solid non-gap portions.

9. A display panel, comprising the flexible substrate of claim 1; and a plurality of light emitting elements on the plurality of solid non-gap portions of the flexible base substrate.

10. The display panel of claim 9, further comprising a barrier layer on the plurality of solid non-gap portions of the flexible base substrate;
   wherein the plurality of light emitting elements are on a side of the barrier layer away from the flexible base substrate.

11. The display panel of claim 9, further comprising an encapsulating layer on a side of the plurality of light emitting elements away from the flexible base substrate, encapsulating the plurality of light emitting elements and a plurality of thin film transistors on the plurality of solid non-gap portions of the flexible base substrate.

12. The display panel of claim 9, further comprising a back film on a side of the flexible base substrate away from the plurality of light emitting elements;
   wherein the back film has a stretchability equal to or less than a stretchability of a remainder of the display panel.

13. The display panel of claim 9, further comprising an array of a plurality of thin film transistors, a plurality of gate lines, and a plurality of data lines, on the plurality of solid non-gap portions of the flexible base substrate;
   a respective one of the plurality of gate lines is connected to a row of thin film transistors of the array of the plurality of thin film transistors; and
   a respective one of the plurality of data lines is connected to a column of thin film transistors of the array of the plurality of thin film transistors;
   wherein the respective one of the plurality of gate lines extends through regions corresponding to multiple interconnected solid non-gap portions of the plurality of solid non-gap portions along a row direction of the array of the plurality of thin film transistors; and
   the respective one of the plurality of data lines extends through regions corresponding to multiple interconnected solid non-gap portions of the plurality of solid non-gap portions along a column direction of the array of the plurality of thin film transistors.

14. The display panel of claim 9, wherein the display panel is a stretchable display panel.

15. A method of fabricating a flexible substrate, comprising forming a flexible base substrate comprising a flexible material:
   wherein forming the flexible base substrate comprises forming a plurality of gaps and forming a plurality of solid non-gap portions, at least two adjacent solid non-gap portions of the plurality of solid non-gap portions formed to be interconnected; and
   forming the flexible base substrate comprises forming a strengthening layer in the plurality of solid non-gap portions, the strengthening layer formed to comprise a strengthening material having a Young's modulus greater than a Young's modules of the flexible material.

16. The method of claim 15, wherein forming the flexible base substrate further comprises:
   forming a first flexible sub-layer;
   forming the strengthening layer on the first flexible sub-layer; and
   forming a second flexible sub-layer on a side of the strengthening layer away from the first flexible sub-layer, the second flexible sub-layer formed to cover the strengthening layer, thereby embedding the strengthening layer.

17. The method of claim 16, wherein the first flexible sub-layer and the second flexible sub-layer are formed using a same flexible material.

18. The method of claim 16, wherein forming the strengthening layer comprises:
   forming a metallic material layer on the first flexible sub-layer; and
   patterning the metallic material layer to form the strengthening layer.

19. The method of claim 16, further comprising:
   forming a barrier layer on a side of the second flexible sub-layer away from the first flexible sub-layer; and
   patterning the first flexible sub-layer, the second flexible sub-layer, and the metallic material layer simultaneously using the barrier layer as a mask plate, thereby forming the strengthening layer and the plurality of gaps in the flexible base substrate in a single patterning process.

20. The method of claim 15, further comprising:
   forming a barrier layer on a side of the second flexible sub-layer away from the first flexible sub-layer; and
   etching the flexible base substrate using the barrier layer as a mask plate to form the plurality of gaps in the flexible base substrate.

* * * * *